(12) United States Patent
Katsumata et al.

(10) Patent No.: US 11,616,180 B2
(45) Date of Patent: Mar. 28, 2023

(54) LIGHT EMITTING DEVICE, AND METHOD OF MANUFACTURING LIGHT EMITTING DEVICE

(71) Applicant: NICHIA CORPORATION, Anan (JP)

(72) Inventors: Masaaki Katsumata, Anan (JP); Koji Taguchi, Anan (JP); Toshiaki Moriwaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 353 days.

(21) Appl. No.: 16/854,656

(22) Filed: Apr. 21, 2020

(65) Prior Publication Data

US 2020/0343424 A1 Oct. 29, 2020

(30) Foreign Application Priority Data

Apr. 26, 2019 (JP) .............................. JP2019-085670

(51) Int. Cl.
  *H01L 33/62* (2010.01)
  *H01L 33/00* (2010.01)
  *H01L 23/00* (2006.01)

(52) U.S. Cl.
  CPC .............. *H01L 33/62* (2013.01); *H01L 24/45* (2013.01); *H01L 33/005* (2013.01); *H01L 2933/0016* (2013.01); *H01L 2933/0033* (2013.01)

(58) Field of Classification Search
  CPC combination set(s) only.
  See application file for complete search history.

(56) References Cited

U.S. PATENT DOCUMENTS

| 2013/0099666 | A1 | 4/2013 | Stuffle |
| 2016/0268478 | A1* | 9/2016 | Tomizawa ............. H01L 33/42 |
| 2017/0005247 | A1* | 1/2017 | Maki .................... H01L 27/153 |
| 2017/0179344 | A1 | 6/2017 | Matsuda |
| 2018/0043178 | A1 | 2/2018 | Iguchi et al. |

FOREIGN PATENT DOCUMENTS

| JP | 2011113731 A | 6/2011 |
| JP | 2011129646 A | 6/2011 |
| JP | 2012124443 A | 6/2012 |
| JP | 2016054267 A | 4/2016 |
| JP | 2017118098 A | 6/2017 |
| JP | 2018160690 A | 10/2018 |
| WO | 2016136345 A1 | 9/2016 |

* cited by examiner

*Primary Examiner* — Ratisha Mehta
(74) *Attorney, Agent, or Firm* — Global IP Counselors, LLP

(57) ABSTRACT

A light emitting device includes a base, a first external terminal, a second external terminal, a plurality of wirings respectively electrically connecting the first external terminal and the second external terminal, and a plurality of light emitting elements each electrically connected to a corresponding one of the wirings. The wirings include a first wiring connecting the first external terminal and the second external terminal at a smallest distance, a second wiring longer than the first wiring, and a third wiring longer than the second wiring. The first, second, and third wirings have a substantially equal electric resistance. At least two of the first, second and third wirings are each provided with at least two of the light emitting elements with an average width in an intermediate region between adjacent ones of the light emitting elements being smaller than an average width in a region other than the intermediate region.

14 Claims, 11 Drawing Sheets

LIGHT EMITTING DEVICE, AND METHOD OF MANUFACTURING LIGHT EMITTING DEVICE

CROSS-REFERENCE TO RELATED PATENT APPLICATION

The present application claims priority under 35 U.S.C. § 119 to Japanese Patent Application No. 2019-085670, filed Apr. 26, 2019. The contents of Japanese Patent Application No 2019-085670 are incorporated herein by reference in their entirety.

BACKGROUND

Technical Field

The present disclosure relates to a light emitting device and a method of manufacturing the light emitting device.

Description of Related Art

There has been known a small light emitting device in which, instead of being disposed in a "housing", lateral surfaces of a light emitting element are covered by a reflecting member, and plating electrodes in contact with the lower surfaces of the bump electrodes and a lower surface of the sealing member are provided (for example, Japanese Unexamined Patent Publication No. 2012-124443).

There has been known a method of manufacturing a light emitting device in which a metal layer continuously covering a pair of electrodes is disposed and a portion of the metal layer is removed by irradiating a laser light (for example, Japanese Unexamined Patent Publication No. 2017-118098).

There have been known LED modules having a plurality of wirings of different widths (for example, Japanese Unexamined Patent Publication No. 2011-129646).

Further, there has been known a light emitting device having a plurality of mounting surface side wiring patterns having the same shape and arranged at different distances from a power feeding part (for example, Japanese Unexamined Patent Publication No. 2016-054267).

SUMMARY

According to one aspect of the present disclosure, a light emitting device includes: a base; a first external terminal disposed on the base; a second external terminal disposed on the base; a plurality of wirings disposed on the base, and a plurality of light emitting elements. The wirings include a first wiring electrically connecting the first external terminal and the second external terminal at a first distance, a second wiring electrically connecting the first external terminal and the second external terminal at a second distance greater than the first distance, and a third wiring electrically connecting the first external terminal and the second external terminal at a third distance greater than the second distance. The first wiring, the second wiring, and the third wiring have a substantially equal electric resistance. Each of the light emitting elements is electrically connected to a corresponding one of the plurality of wirings such that at least two of the first wiring, the second wiring, and the third wiring are each provided with at least two of the light emitting elements with an average width in an intermediate region between adjacent ones of the light emitting elements being smaller than an average width in a region other than the intermediate region and not provided with any of the light emitting elements.

According to another aspect of the present disclosure, a light emitting device includes: a base; a first external terminal disposed on the base; a second external terminal disposed on the base; a plurality of wirings disposed on the base; and a plurality of light emitting elements. The wirings include a first wiring electrically connecting the first external terminal and the second external terminal at a first distance, a second wiring electrically connecting the first external terminal and the second external terminal at a second distance greater than the first distance, the second wiring having a planar dimension and a width greater than a planar dimension and a width, respectively, of the first wiring in a plan view, and a third wiring electrically connecting the first external terminal and the second external terminal at a third distance greater than the second distance, the third wiring having a planar dimension and a width greater than the planar dimension and the width, respectively, of the second wiring in the plan view. Each of the light emitting elements is electrically connected to a corresponding one of the wirings such that at least two of the first wiring, the second wiring, and the third wiring are each provided with at least two of the light emitting elements with a width in an intermediate region between adjacent ones of the light emitting elements being smaller than a width of another region having a substantially same length as the intermediate region and not provided with any of the light emitting elements.

According to further aspect of the present disclosure, a light emitting device includes: a base; a first external terminal disposed on the base; a second external terminal disposed on the base; a plurality of wirings disposed on the base; and a plurality of light emitting elements. The wiring include a first wiring electrically connecting the first external terminal and the second external terminal at a first distance, a second wiring electrically connecting the first external terminal and the second external terminal at a second distance greater than the first distance, the second wiring having a thickness greater than a thickness of the first wiring, and a third wiring electrically connecting the first external terminal and the second external terminal at a third distance greater than the second distance, the third wiring having a thickness greater than the thickness of the second wiring. Each of the light emitting elements is electrically connected to a corresponding one of the wirings.

In one aspect, a method of manufacturing a light emitting device includes: providing a plurality of light emitting components each including a light emitting element having a first surface and a pair of electrodes at the first surface side, and a first covering member covering a corresponding one of the light emitting elements except for portions of surfaces of the electrodes to expose the portions of the surfaces of the electrodes; disposing the light emitting components on exposed portions of a light guide plate covered by a second covering member except for the exposed portions, or disposing the light emitting components on a light guide plate and covering the light emitting components and the light guide plate by the second covering member; disposing a metal paste layer continuously covering the portions of the surfaces of the electrodes, the first covering member, and the second covering member; and irradiating a laser light on the metal paste layer to remove a portion of the metal paste layer on the first covering member and the electrodes to form so as not to create short-circuit between the electrodes. The disposing of the metal paste layer includes forming a first external terminal, a second external terminal, and a plurality of wirings each electrically connected to the electrodes of a corresponding one of the light emitting elements. The wirings include a first wiring electrically connecting the first external terminal and the second external terminal at a first distance, a second wiring electrically connecting the first external terminal and the second external terminal at a second distance greater than the first distance, the second wiring having a planar dimension and a width greater than a planar dimension and a width, respectively, of the first wiring in a plan view, and a third wiring electrically connecting the first external terminal and the second external terminal at a third distance greater than the second distance, the third wiring having a planar dimension and a width greater than the planar dimension and the width, respectively, of the second wiring in the plan view.

In another aspect, a method of manufacturing a light emitting includes: providing a plurality of light emitting components each including a light emitting element having a first surface and a pair of electrodes at the first surface side, and a first covering member covering a corresponding one of the light emitting elements except for portions of surfaces of the electrodes to expose the portions of the surfaces of the electrodes; disposing the light emitting components on exposed portions of a light guide plate covered by a second covering member except for the exposed portions, or disposing the light emitting components on a light guide plate and covering the light emitting components and the light guide plate by the second covering member; disposing a metal paste layer continuously covering the portions of the surfaces of the electrodes, the first covering member, and the second covering member; and irradiating a laser light on the metal paste layer to remove a portion of the metal paste layer on the first covering member and the electrodes so as not to create short-circuit between the electrodes. The disposing of the metal paste layer includes forming a first external terminal, a second external terminal, and a plurality of wirings each electrically connected to the electrodes of a corresponding one of the light emitting elements. The wirings include a first wiring electrically connecting the first external terminal and the second external terminal at a first distance, a second wiring electrically connecting the first external terminal and the second external terminal at a second distance greater than the first distance, the second wiring having a thickness greater than a thickness of the first wiring, and a third wiring electrically connecting the first external terminal and the second external terminal at a third distance greater than the second distance, and the third wiring having a thickness greater than the thickness of the second wiring.

Accordingly, a light emitting device of a small size and can emit light with little color unevenness, and a method of manufacturing the light emitting device can be provided.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENTS

Next, embodiments of the present disclosure will be described in detail with reference to the drawings. In the description below, when appropriate, terms which indicate specific directions or locations (for example, "up", "down", "right", "left" and other terms expressing those) may be applied. But those terms are used for easy understanding of the disclosure with reference to the accompanying drawings, and thus the technical scope of the disclosure shall not be limited by the meaning of those terms. The same numerals in different drawings indicate the same or similar portions or members. The resin members such as the first light-transmissive member, the second light-transmissive member, and the covering member will be described using the same names regardless of the respective before and after the molding, curing, hardening, and singulating. That is, a member that takes different states or shapes in the course of manufacturing, such as a material that is a liquid before molding, a sold after molding which is then divided to have a different shape will be described using the same name throughout the manufacturing. The light emitting device may be described using an X-axis, a Y-axis orthogonal to the X-axis, and a Z-axis orthogonal to both the X-axis and the Y-axis. In the present specification, a straight-line direction passing through the first external terminal 23 and the second external terminal 24 is indicated as an X-direction. The term "plan view" indicates a plane including the X-axis and the Y-axis that are intersecting with each other.

Figure 1:
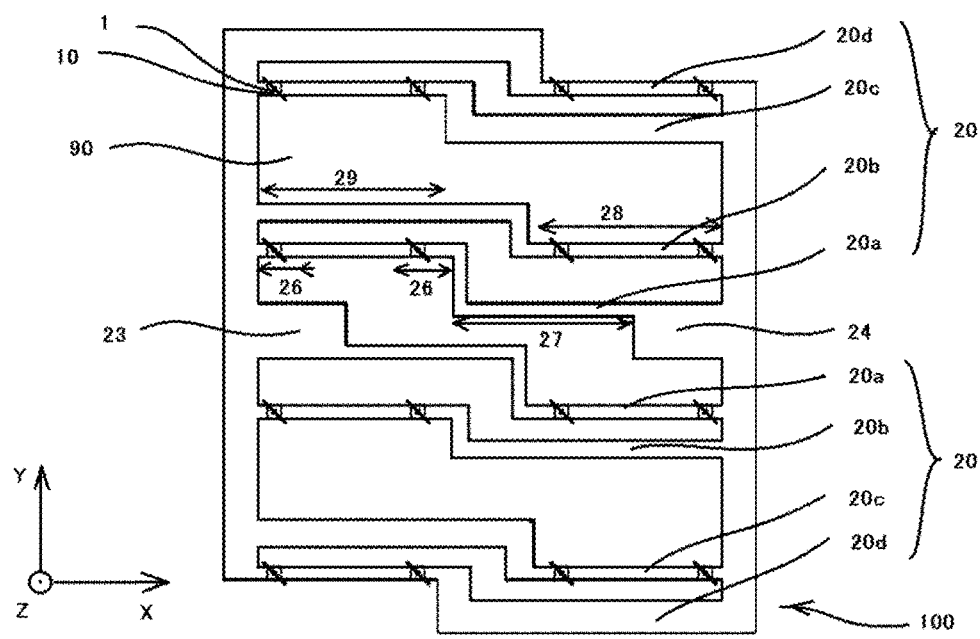
FIG. 1 is a schematic plan view illustrating arrangements of external terminals, wirings and light emitting elements in a light emitting device according to a first embodiment.

A light emitting device according to a first embodiment will be described below with reference to figures. FIG. 1 is a schematic plan view of a light emitting device according to a first embodiment.

A light emitting device 100 at least includes a base 90, a first external terminal 23 disposed on the base 90, a second external terminal 24 disposed on the base 90, a plurality of wirings 20 disposed on the base 90, the plurality of wirings 20 respectively being configured to be electrically connected to the first external terminal 23 and the second external terminal 24, and a plurality of light emitting elements 1 each electrically connected to a corresponding one of the plurality of wirings 20. Each of the plurality of wirings 20 at least includes a first wiring 20a connecting the first external terminal 23 and the second external terminal 24 at a first distance that is the smallest distance among distances connecting the first external terminal 23 and the second external terminal 24, a second wiring 20b connecting the first external terminal 23 and the second external terminal 24 at a second distance greater than the first distance, and a third wiring 20c connecting the first external terminal 23 and the second external terminal 24 at a third distance greater than the second distance. At least two of the plurality of light emitting elements 1 are disposed on each of at least two wirings of the first wiring 20a, the second wiring 20b, and the third wiring 20c.

Each of the wirings has an average width at a region 28 (one example of an intermediate region) between adjacent two light emitting elements, the average width is smaller than an average width of a region 29 other than the region 28 between adjacent two light emitting elements and not provided with any of the light emitting elements. In the present embodiment, each of the wirings has portions of different widths and a comparison is made between the different widths. In the comparison, the width of the region 28 between adjacent two light emitting elements and the width of the region 29 that is not located between adjacent two light emitting elements and not provided with any of the light emitting elements are compared using their average widths. In the comparison of the widths, a portion to be described below, common to two or more of the wirings is excluded. The term "width" as used herein refers to the shortest distance in a lateral direction perpendicular to a longitudinal direction passing through the first external terminal 23 and the second external terminal 24.

The first wiring 20a, the second wiring 20b, and the third wiring 20c have a substantially equal electric resistance value. The expression "substantially equal electric resistance values" or "substantially equal electric resistance" refers to a difference in the electric resistance value among the wirings of preferably 1Ω or less, more preferably 0.3Ω or less. With the structure as described above, a light emitting device of a small size and can emit light with little color unevenness can be provided. In other words, aligning electrical resistance values of the plurality of light emitting elements can reduce unevenness in luminance among the light emitting elements.

The term "length of wiring 20" refers to a distance between the first external terminal 23 and the second external terminal 24 along the wiring 20 that connects the first external terminal 23 and the second external terminal 24, which may include one or more wiring portions common to two or more among the first wiring 20a, the second wiring 20b, and the third wiring 20c. The one or more common wiring portions will be excluded in the comparison of the widths of the wirings. The number of the wirings in the wiring 20 can be appropriately determined. In certain embodiments, the wiring 20 also includes a fourth wiring 20d.

The light emitting device according to the first embodiment includes, in a plan view, the second wiring 20b has a planar dimension greater than a planar dimension of the first wiring 20a, the third wiring 20c having a planar dimension greater than the planar dimension of the second wiring 20b, and the second wiring 20b has a width greater than a width of the first wiring 20a, and the third wiring 20c has a width greater than the width of the second wiring 20b. With the structure as described above, a light emitting device of a small size and can emit light with little color unevenness can be provided. In other words, aligning electrical resistance values of the plurality of light emitting elements can reduce unevenness in luminance among the light emitting elements. In particular, forming the wirings with a smaller width in regions where corresponding light emitting elements are to be disposed and with a greater width in regions where none of the light emitting elements are to be disposed, allows for alignment of resistance while also facilitating the manufacturing of the light emitting device.

As shown in FIG. 1, the first wiring 20a is provided with two light emitting elements 1 that are located within a half at the first external terminal 23 side or within a half at the second external terminal 24 side of the light emitting device in a plan view. The second wiring 20b, the third wiring 20c, and the fourth wiring 20d also have similar arrangements. The two light emitting elements 1 on the first wiring 20a and the two light emitting elements 1 on the second wiring 20b are aligned in a straight line in the X-direction. Likewise, the two light emitting elements 1 on the third wiring 20c and the two light emitting elements 1 on the fourth wiring 20d are aligned in a straight line in the X-direction. The light emitting elements are also aligned in respective straight lines in the Y-direction. A total of 16 light emitting elements 1 may be used in a single light emitting device or in a single segment.

The first wiring 20a, the second wiring 20b, and the third wiring 20c preferably have the same thickness. In the present embodiment, the term "same thickness" refers to thicknesses in a range of 90% to 110% with respect to a predetermined thickness, in the thickness direction. This is because when the base 90 has an irregular surface, and/or there is an irregularity in manufacturing, the thickness of the wirings may be slightly varied.

The first wiring 20a, the second wiring 20b, and the third wiring 20c preferably have thicknesses greater in the second regions 27 where the light emitting elements 1 are not disposed, than the thicknesses in the first regions 26 where corresponding light emitting elements 1 are to be disposed. This arrangement allows for a reduction in electric resistance in the second regions 27 where the light emitting elements 1 are not disposed, which can improve the electrical conductivity of the second regions 27. Further, the reduction in the thicknesses of the first regions 26 provided with the light emitting elements 1 allows for removing portions of an electrically conductive paste layer such as the metal paste layer with a lower power laser light or in a shorter time during disposing the wirings 20. In the present embodiment, the term "first regions 26" where the light emitting elements 1 to be disposed refers not only to the portions directly under the packages 10 each including the light emitting element 1, the first light-transmissive member 3, etc., but also to the portions for disposing adhesive material, etc.

The first wiring 20a, the second wiring 20b, and the third wiring 20c preferably have widths greater in the second regions 27 where none of the light emitting elements 1 is to be disposed than the widths in the first regions 26 where the light emitting elements 1 are to be disposed. This arrangement allows for a reduction in electric resistance in the second regions 27 where the light emitting elements 1 are not disposed, accordingly the electrical conductivity of the second regions 27 can be enhanced. Further, the reduction in the widths of the first regions 26 provided with the light emitting elements 1 allows for removing portions of an electrically conductive paste layer such as the metal paste layer with a lower power laser light or in a shorter time during disposing the wirings 20.

It is preferable that the first external terminal 23 and the second external terminal 24 are disposed aligned in the X-axis direction and at least two among the first wiring 20a and the second wiring 20b and the third wiring 20c share a common portion extending along a Y-axis direction orthogonal to the X-axis direction. Such a common portion allows to reduce the electric resistance and also reduce the occurrence of disconnection.

The light emitting device preferably includes an electrically insulating member 60 covering at least the first regions 26. With this, the occurrence of short-circuit and/or malfunction can be reduced.

The electrically insulating member 60 is preferably colored. The electrically insulating member 60 can be either transparent, translucent, or opaque, but in order to check the connection state of the wirings 20, the electrically insulating member 60 is preferably transparent or translucent to the wavelength range of a measuring device. For the measuring device, a spectrophotometer is preferably used. For example, the spectrophotometer preferably uses a blue light with a peak wavelength of 480 nm, a green light with a peak wavelength of 520 nm, a red light with a peak wavelength of 600 nm, or the like, but an appropriate wavelength can be used. The electrically insulating member 60 may be transparent, but it is particularly preferable to be colored to a degree that allows checking whether the electrically insulating member 60 is disposed on the first covering member 2 or the like, or checking the connection state of the wirings 20 through the electrically insulating member 60. For example, the electrically insulating member 60 preferably contains a coloring agent, a pigment, or/and a dye of blue color, green color, or red color. The electrically insulating member 60 may have an optical transmittance, for example, in a range of 20% to 95%, preferably in a range of 30% to 80%. The optical transmittance of the electrically insulating member 60 can be measure by using a transmittance measuring device. The electrically insulating member 60 preferably has a film shape with a thickness preferably in a range of 0.5 μm to 100 μm. The electrically insulating member 60 preferably has a circular shape, an elliptic shape, a rectangular shape, or the like with a maximum diameter of 0.5 to 3 times with respect to the maximum diameter of the package 10.

Figure 2A:
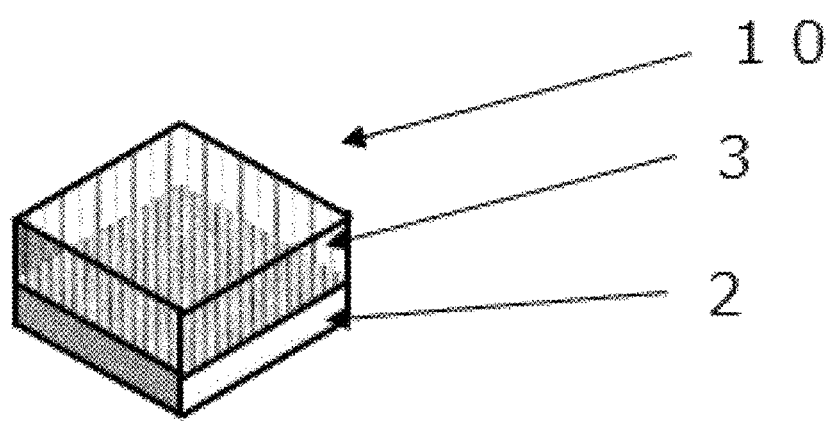
FIG. 2A is a schematic perspective view of a package according to the first embodiment, seen from obliquely above.
Figure 2B:
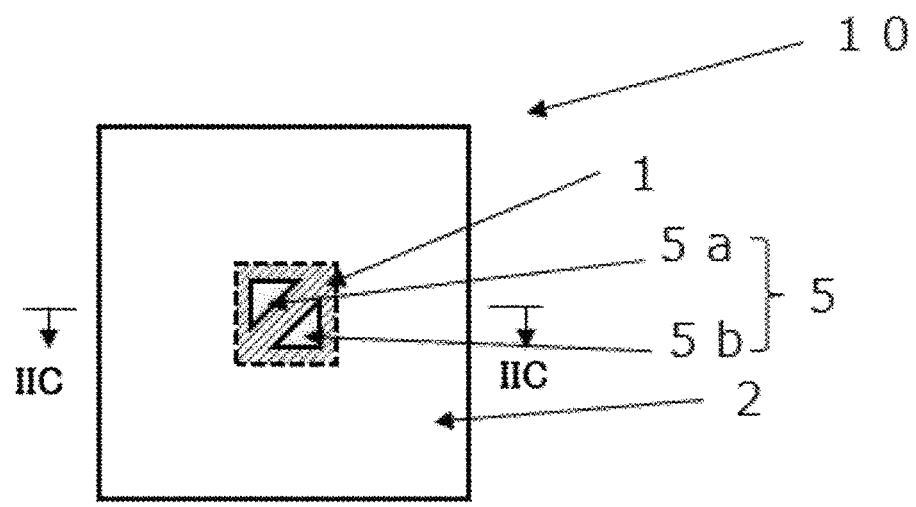
FIG. 2B is a schematic bottom view of a package according to the first embodiment.
Figure 2C:
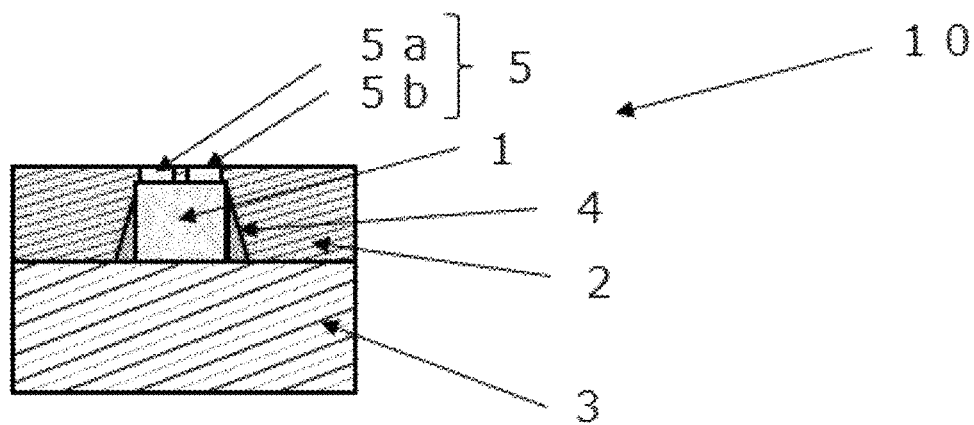
FIG. 2C is a schematic cross-sectional view of a package according to the first embodiment.

FIG. 2A to FIG. 2C show a package 10 according to the first embodiment. FIG. 2A is a schematic perspective view of a package according to the first embodiment, seen from obliquely above. FIG. 2B is a schematic bottom view of a package according to the first embodiment. FIG. 2C is a cross-sectional view, taken along line IIC-IIC of FIG. 2A, schematically showing a package according to the first embodiment. In the description below, an example of a light emitting component will be illustrated using the package 10 which includes a light emitting element 1 and a first covering member 2, or includes only the light emitting element 1, various types of the light emitting component can be appropriately employed.

The package 10 includes a light emitting element 1, a first covering member 3, a first light-transmissive member 3, a second light-transmissive member 4, and a pair of electrodes 5. The package 10 may have a rectangular parallelepiped shape, but can have any other appropriate shape. The light emitting element 1 may have a rectangular shape in a plan view, but may have a polygonal shape such as a triangular shape, a pentagonal shape, or a hexagonal shape. For example, the light emitting element 1 has a layered structure including a first semiconductor layer, an active layer, and a second semiconductor layer disposed on a substrate, in which portions of the active layer and the second semiconductor layer are removed. The light emitting element 1 includes a first surface and a second surface located opposite to the first surface, with a pair of electrodes 5 at the first surface side. The term "first surface side" is intended to include not only a case in which the electrodes are disposed directly on the light emitting element 1, but also cases in which the electrodes are indirectly disposed via other members such as a semiconductor layer, a metal, or the like. The pair of electrodes 5 include a first electrode 5a and a second electrode 5b having different polarities. The first electrode 5a is electrically connected to the first semiconductor layer and the second electrode 5b is electrically connected to the second semiconductor layer. A first light-transmissive member 3 is disposed at the second surface side of the light emitting element 1. In a plan view, the first light-transmissive member 3 may have a size either greater than, same as, or smaller than that of the second surface of the light emitting element 1. When the first light-transmissive member 3 has a size substantially the same or greater than the second surface of the light emitting element 1, a second light-transmissive member 4 may be disposed on lateral surfaces of the light emitting element 1. The first light-transmissive member 3 may have a rectangular shape in a plan view, but may have a polygonal shape such as a triangular shape, a pentagonal shape, or a hexagonal shape. It is preferable that the second light-transmissive member 4 sticks the light emitting element 1 and the first light-transmissive member 3 together. The first covering member 2 is disposed to cover the first surface and the lateral surfaces of the light emitting element 1, the first light-transmissive member 3, and the second light-transmissive member 4, while exposing the surfaces of the pair of electrodes 5. The first covering member 2 may be formed in a single step or may be formed in a plurality of steps. When the first covering member 2 is disposed in a plurality of steps, the first covering member 2 may include a plurality of layers, or a single layer without having interfaces.

Using the package or only the light emitting element as described above, the light emitting device can be fabricated according the steps to be described below. FIG. 3A to FIG. 3E are schematic cross-sectional views illustrating a method of manufacturing a light emitting device according to the first embodiment. The use of two packages is illustrated, but a plurality of packages can be used. FIG. 4A to FIG. 4D are schematic bottom views illustrating a method of manufacturing a light emitting device according to the first embodiment.

Figure 3A:
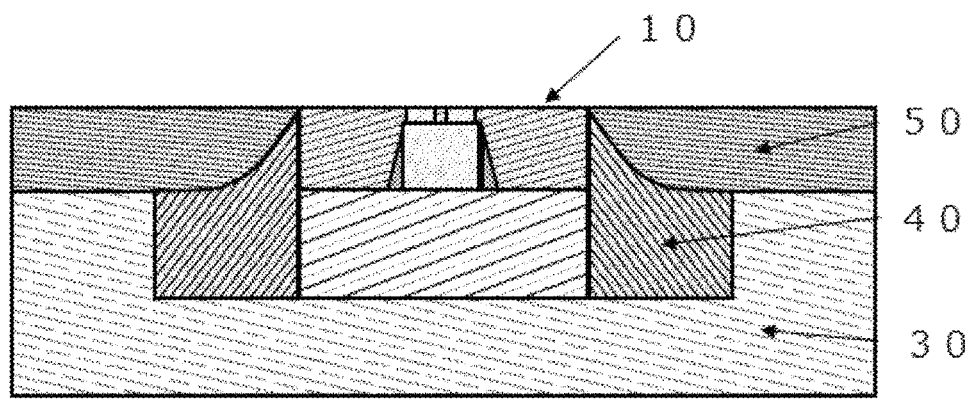
FIG. 3A is a schematic cross-sectional view illustrating a method of manufacturing a light emitting device according to the first embodiment.
Figure 3B:
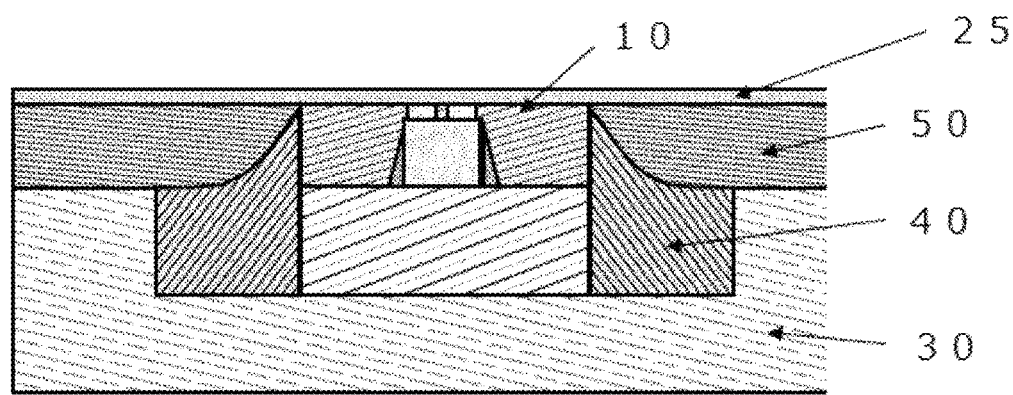
FIG. 3B is a schematic cross-sectional view illustrating the method of manufacturing a light emitting device according to the first embodiment.
Figure 3C:
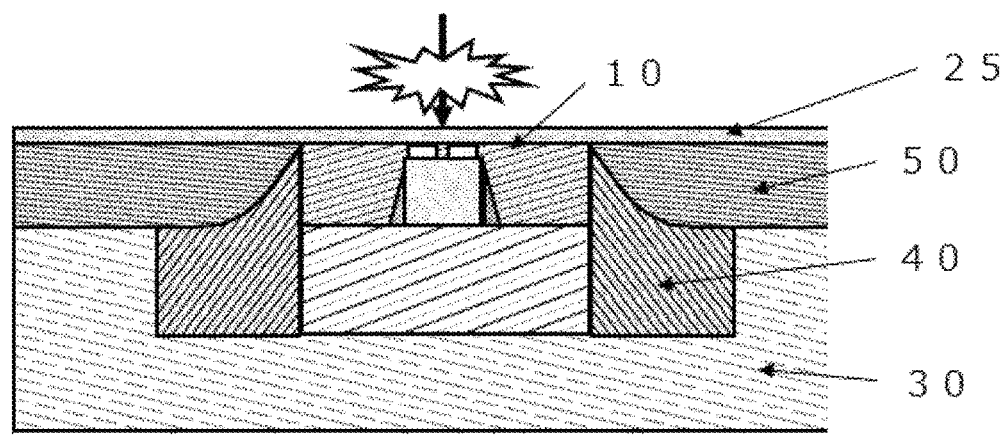
FIG. 3C is a schematic cross-sectional view illustrating the method of manufacturing a light emitting device according to the first embodiment.
Figure 3D:
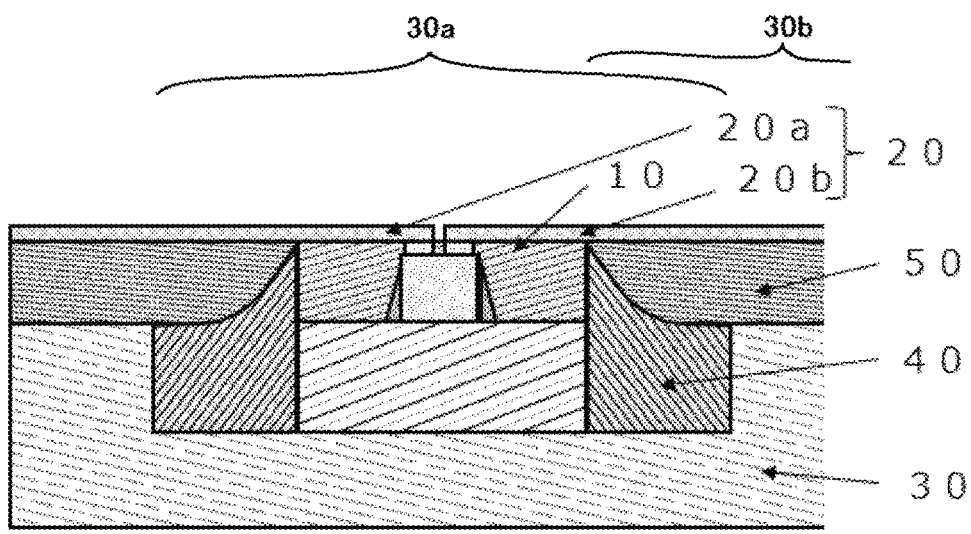
FIG. 3D is a schematic cross-sectional view illustrating the method of manufacturing a light emitting device according to the first embodiment.
Figure 4A:
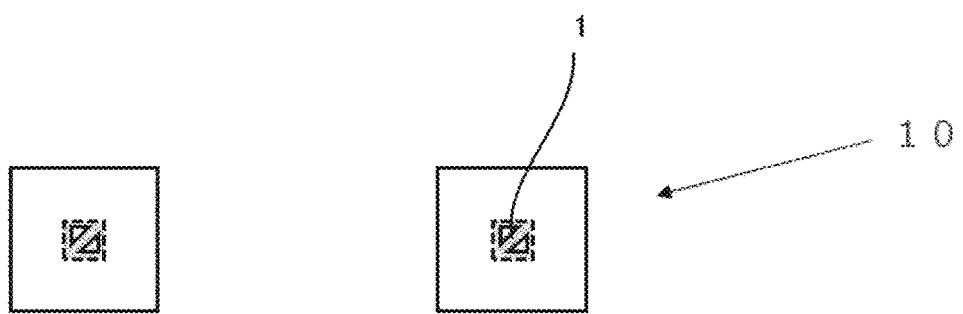
FIG. 4A is a schematic bottom view illustrating the method of manufacturing a light emitting device according to the first embodiment.
Figure 4B:
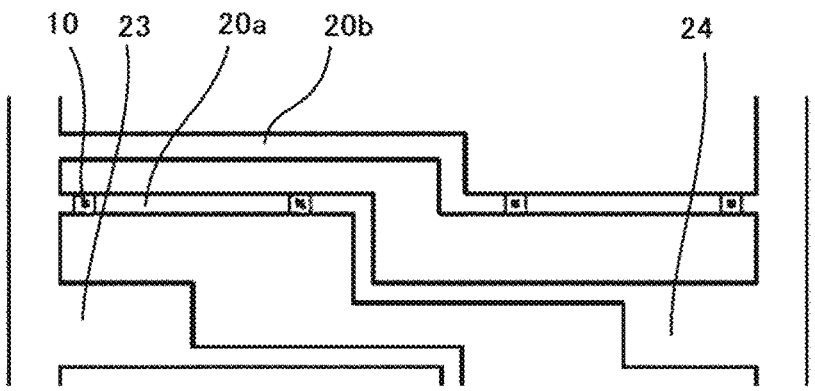
FIG. 4B is a schematic bottom view illustrating the method of manufacturing a light emitting device according to the first embodiment.
Figure 4C:
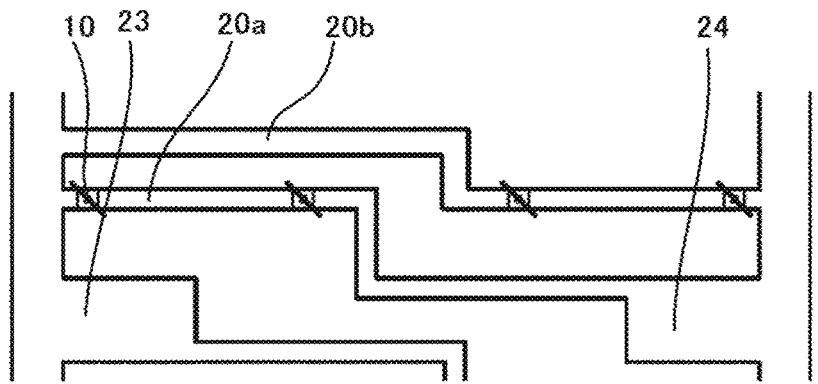
FIG. 4C is a schematic bottom view illustrating the method of manufacturing a light emitting device according to the first embodiment.

A method of manufacturing a light emitting device according to the first embodiment includes: providing a plurality of light emitting components each includes a light emitting element 1 having a first surface and having a pair of electrodes 5 at the first surface side, and a first covering member 2 covering a corresponding one of the light emitting elements 1 except for portions of surfaces of the pair of electrodes 5 to expose the portions of the surfaces (FIG. 2A-2C and FIG. 4A); disposing the plurality of light emitting components on exposed portions of a light guide plate 30 covered by a second covering member 50 except for the exposed portions, or disposing the plurality of light emitting components on a light guide plate 30 and covering the plurality of light emitting components 1 and the light guide plate 30 by a second covering member 50 (FIG. 3A); disposing a metal paste layer 25 continuously covering the exposed portions of each of the pair of electrodes 5, the first covering member 2, and the second covering member 50 (FIG. 3B and FIG. 4B); irradiating a laser light on a predetermined portion of the metal paste layer 25 on each of the pair of electrodes 5 and on portions of the metal paste layer 25 on the first covering member 2 to remove the portions of the metal paste layer 25 on each of the pair of electrodes 5 and the portions of the metal paste layer 25 on the first covering member 2 to form a pair of wirings 20 so as not to create short-circuit between the pair of electrodes 5 (FIGS. 3C and 3D, and FIG. 4C).

In the disposing a metal paste layer 25, the metal paste layer 25 is disposed to form a first external terminal 23, a second external terminal 24, and a plurality of wirings 20 electrically connecting the first external terminal 23 and a second external terminal 24, each of the plurality of wirings 20 is electrically connected to a pair of electrodes 5 of a corresponding one of the plurality of light emitting elements 1, each of the plurality of wirings 20 at least includes a first wiring 20a connecting the first external terminal 23 and the second external terminal 24 at a first distance that is the smallest distance among distances connecting the first external terminal 23 and the second external terminal 24, a second wiring 20b connecting the first external terminal 23 and the second external terminal 24 at a second distance greater than the first distance, and a third wiring 20c connecting the first external terminal 23 and the second external terminal 24 at a third distance greater than the second distance. In a plan view, the second wiring 20b has a planar dimension greater than a planar dimension of the first wiring 20a, and the third wiring 20c has a planar dimension greater than the planar dimension of the second wiring 20b, and the second wiring 20b has a width greater than a width of the first wiring 20a and the third wiring 20c has a width greater than the width of the second wiring 20b. Accordingly, a light emitting device of a small size and can emit light with little color unevenness can be provided.

Irradiating a laser light on the predetermined portion of the metal paste layer 25 to generate laser ablation to remove the predetermined portion of the metal paste layer 25 on each of the plurality of light emitting components. Accordingly, patterning of the metal paste layer 25 is performed such that the metal paste layer 25 can be formed into the wiring 20, the first external terminal 23, and the second external terminal 24. Laser ablation is a phenomenon in which irradiation of laser light equal to or greater than certain irradiation intensity (threshold) on a surface of solid material induces the removal of a portion of the surface. The use of laser ablation allows for patterning of the metal paste layer without the use of a mask or the like.

For example, in a comparative method, when a metal layer is used to form a wiring, forming the metal layer requires advanced equipment with a complicated manufacturing process with high manufacturing costs such as sputtering or vapor deposition. Further, disconnection tends to occur with the metal layer of a small thickness, requiring the metal layer of a greater thickness. Meanwhile, irradiating a laser light to a metal layer so as not to create a short circuit to generate laser ablation to form foreign electrodes, the metal layer of a greater thickness requires a higher laser output power and/or laborious processing due to melting of the metal and subsequent removal, which requires an improvement in working efficiency.

In contrast, with the use of the metal paste layer according to the first embodiment, the wirings can be formed easily with a high precision. Further, the metal paste layer is formed from metal powder mixed with a resin, which allows easy removal of the resin by irradiating a laser light to the metal paste layer, allowing for a significant reduction in the laser output power. Also, the irradiation time of the laser light can be significantly reduced, allowing a significant improvement in the working efficiency. Such a significant improvement in the working efficiency in the use of laser ablation allows to increase the thickness of the metal paste layer, such that the occurrence of disconnection can be reduced. Further, a narrow groove can be formed by using the laser ablation for removing a portion of the metal paste layer, which allows to achieve a light emitting device of a smaller size with high reliability.

A predetermined number of packages can be disposed on a light guide plate. For example, a large number of packages are disposed on a light guide plate, which can be singulated into segments each contains a total of 16 packages arranged in four rows and four columns. A large display of a desired size can be obtained by electrically connecting the segments. In the present embodiment, a single segment may be referred to as a light emitting device.

The respective steps will be described below.

Providing Light Emitting Components

A plurality of light emitting components (for example, packages 10), each includes at least one light emitting element having a first surface and a pair of electrodes 5 at its first surface side, and a first covering member 2 covering the light emitting element 1 except for a portion of each surface of the pair of electrodes 5 to expose the portion of each surface. A predetermined number of the packages 10 are disposed on a light guide plate 30. It is preferable that the packages 10 are disposed on the light guide plate 30 via a third light-transmissive member 40 having adhesive properties. It is preferable that the first light-transmissive member 3 of the packages 10 and the light guide plate 30 are in contact with each other. The light-transmissive member 40 preferably covers lateral surfaces of the first light-transmissive member 3 and lateral surfaces of the second light-transmissive member 2. Accordingly, light emitted from the light emitting element 1 can be spread in lateral directions. A plurality of packages 10 are disposed on the light guide plate 30, and the packages 10 are preferably arranged in a matrix of longitudinal rows and transverse columns. The lateral sides of each of the packages 10 disposed on the light guide plate 30 are preferably covered by a second covering member 50. In the present embodiment, the base 90 includes the light guide plate 30 and the second covering member 50. In order to facilitate formation of the metal paste layer 25 and/or wirings 20, the second covering member 50 preferably has a thickness smaller than a thickness of the package 10, but the second covering member 50 may have a thickness equal to or greater than a thickness of the package 10. The pair of electrodes 5 preferably contain Ag or Cu, to have good electric conductivity.

For the light guide plate 30, a flat plate may be used, and recesses to accommodate the packages 10 may be formed in portions of the flat plate. Each of the recesses preferably has a rectangular shape in a plan view, which correspond to the planar shape of the packages 10, but may have a polygonal shape such as a triangular shape, a pentagonal shape, or a hexagonal shape. The depth of the recesses may be the same as or smaller than a height of the packages 10. When the depth of the recesses is smaller than the height of the packages 10, portions of the packages 10 are protruded from the light guide plate 30 in a cross-sectional view, such that the protruded portions of the lateral surfaces of the packages 10 may be covered by the second covering member 50.

Distance between two adjacent light emitting elements 1 can be determined according to the size of the light emitting device 100 to be obtained and/or the size of the light emitting elements 1, or the like. In a later step in the manufacturing, singulation will be performed cutting the covering member at predetermined locations, such that the light emitting elements 1 or packages 10 are disposed considering the width (a width of cutting blade) etc., required for the singulation.

A first covering member 2 is disposed on a first surface of the light emitting element 1 and between the pair of electrodes 5. The pair of electrodes 5 are spaced apart from each other at an interval of, preferably 10 μm or greater, particularly preferably 20 μm or greater. The interval of the pair of electrodes 5 is preferably 100 μm or less, particularly preferably 50 μm or less. This arrangement can facilitate the formation of a pair of electrodes by irradiating a laser light as described later below, which allows the use of packages 10 of a smaller size. The interval of the electrodes 5 is preferably determined according to the pulse width of the laser light, and the smaller the interval the more preferable so long as not to create a short circuit.

Disposing Light Emitting Components (Disposing Packages)

The light emitting components (e.g., packages 10) are disposed on an exposed portion of the light guide plate 30 covered by the second covering member 50 except for the exposed portion, or the light emitting components (e.g., packages 10) are disposed on the light guide plate 30 and the light emitting components and the light guide plate 30 are covered by the second covering member 50.

In the method in which the light emitting components (e.g., packages 10) are disposed on an exposed portion of the light guide plate 30 covered by the second covering member 50 except for the exposed portion, the second covering member 50 can be provided beforehand, allowing for easy formation of the second covering member 50. When a resin is used for the second covering member 50, the light guide plate 30 may be warped at the time of curing the resin, but such warping can be reduced by holding a portion of the light guide plate 30.

In the method in which the light emitting components (e.g., packages 10) are disposed on the light guide plate 30 and the light emitting components and the light guide plate 30 are covered by the second covering member 50, the second covering member 50 can be disposed on the lateral surfaces and the upper surfaces of the light emitting components (e.g. Packages 10), allowing for a reduction of light leaking through the second covering member 50.

Disposing Metal Paste Layer

A metal paste layer 25 continuously covering the exposed portions of the pair of electrodes 5 and the second covering member 50 is provided.

A plurality of packages 10 are disposed on the light guide plate 30. Each of the packages 10 are disposed on the light guide plate 30 via the third light-transmissive member 40, and the second covering member 50 is disposed on the lateral sides of the respective packages 10. The metal paste layer 25 is disposed continuously on the pair of electrodes 5, the first covering member 2, and the second covering member 50. The metal paste layer 25 is preferably disposed by using printing or spraying. For the printing, a gravure printing technique, a letterpress printing technique, a lithographic printing technique, or a screen printing technique can be employed, among those, a screen printing method is preferably employed. For the spraying, an inkjet printing technique, a pneumatic dispensing technique, or a jet dispensing printing technique can be employed. Thus, without a need of an advanced system such as sputtering or vapor deposition, the metal paste layer 25, further the wirings 20 can be disposed easily. The metal paste layer 25 preferably has a thickness of 1 μm or greater, preferably in a range of 3 μm to 50 μm, particularly preferably in a range of 5 μm to 20 μm. With a thickness of the metal paste layer 25 equal to or greater than certain thickness, electrical conduction can be secured and reliability can be enhanced. With the metal paste layer 25 having a certain thickness, the electric resistance can be reduced. Even when the metal paste layer 25 has such a thickness as described above, laser ablation can be employed to form the wirings 20 easily. The metal paste layer 25 is formed to have a width that permits electrical conduction, for example, a width in a range of 200 to 1,000 μm is preferable, in a range of 400 to 700 μm is particularly preferable.

It is preferable that a plurality of light emitting elements 1 are used in the step of providing light emitting component, the plurality of light emitting elements 1 are continuously covered in the step of disposing a metal paste layer 25, and the plurality of semiconductor elements 1 are electrically connected in the step of forming wirings 20 that to be described later below. Accordingly, the plurality of light emitting elements 1 can be wired easily.

The metal paste layer 25 is preferably formed with a metal powder with a resin, and may further contain an organic solvent. The metal powder preferably has a size in a range of 0.01 to 10 μm, particularly preferably in a range of 0.1 to 5 μm. The metal powder preferably has an approximately spherical shape in view of laser processing. The electrically conducting property of the metal paste layer 25 can be improved by controlling the size of the metal powder. The viscosity can be adjusted when the metal paste layer 25 is disposed by printing. The metal paste layer 25 can be temporarily dried as needed, before curing.

The metal power preferably includes at least one of silver powder, copper powder, and silver power or copper powder covered by a metal film. Accordingly, the electrically conducting property can be enhanced.

The metal paste layer 25 preferably contains the metal powder at a concentration in a range of 60 to 95 mass %. With a high concentration of the metal powder, high electrical conductivity can be obtained while reducing electric resistance. With the ratio of the resin in a certain range, printing or the like can be facilitated.

Forming a Pair of Wirings

A laser light is irradiated to the metal paste layer 25 at a predetermined location between the pair of electrodes 5 and its adjacent portions of the metal paste layer 25 on the first covering member 2 to remove a portion of the metal paste layer 25 between the pair of electrodes 5 and a portion of the metal paste layer 25 on the adjacent portions of the first covering member 2, to form a pair of wirings 20 so as not to create short-circuit 5 between the and negative electrodes 5. The wirings 20 are formed by separating a portion of the metal paste layer 25, and not by using a material other than the metal paste layer 25. By removing a portion of the metal paste layer 25 by irradiating a laser light, the metal paste layer 25 is separated between the pair of electrodes 5 of a single light emitting elements 1 to create a pair of wirings 20, in which a pair of wirings of the light emitting element 1 are connected to corresponding portions of the metal paste layer 25 covering electrodes of adjacent ones of the light emitting elements 1. That is, if a portion of the metal paste layer 25 between the electrodes of one of two adjacent light emitting elements 1 is separated but a portion of the metal paste layer 25 between the electrodes of another one of the light emitting elements 1 remains connected, the metal paste layer 25 does not function as the wirings.

The metal paste layer 25 is disposed by printing or spraying, and the resin contained in the metal paste layer 25 is cured by heating or irradiating a laser light. Then, a laser light is irradiated on the cured metal paste layer 25. Pulsed laser irradiation is preferably used with appropriately adjusting a duration of a single pass. Irradiation of pulsed laser is preferably in a range of once to ten times, particularly preferably in a range of two times to five times. The metal paste layer 25 with a greater thickness can enhance electrical conductivity and reduce electric resistance, but it requires an increased number of pulsed laser irradiation in order to separate the metal paste layer 25 so as not to create a short circuit between the first electrode 5a and the second electrode 5b. The increase in the number of pulsed laser irradiation elongates the operation time to form the pair of wirings 20, and therefore, a smaller number of pulsed irradiation is preferable. Accordingly, pulsed laser irradiation is preferably in a range of twice to five times. Further, a single location may be irradiated with pulsed laser consecutively several times, but is causes accumulation of heat. Thus, the laser may be shifted so as not to irradiate the same location for consecutive times and to irradiate pulsed laser on the location after a certain period of time. The use of laser light allows for a minute processing while maintaining high positioning accuracy of the location to separate. The intensity of the laser light, the diameters of the irradiating spots, and the shifting speed of the irradiating spots can be set in view of the thermal conductivities of the first covering member 2 and the metal paste layer 25 and a difference of the thermal conductivities, so as to create laser ablation on the predetermined location of the metal paste layer 25 on the first covering member 2.

The wavelength of the laser light may be in an infrared region (for example about 1064 nm), in a red region (for example about 640 nm), in a green region (for example about 532 nm), or in a blue to ultraviolet region (for example about 355 nm) that is a shorter wavelength than the green region. In the ultraviolet range, laser ablation can be efficiently performed and mass productivity can be enhanced. The pulse width of the laser light can be in a range of nanoseconds, picoseconds, or femtoseconds. For example, a laser light with a pulse width in a range of nanoseconds in a green region of about 532 nm is preferably used in view of the output power of the laser light and working efficiency.

It is preferable to irradiate a laser light with a width smaller than the interval between the pair of electrodes 5. For example, when the interval between the first electrode 5a and the second electrode 5b is 30 μm, the use of laser light having a machining width of about 30 μm can produce a distance of 30 μm between the first wiring 20a and the second wiring 20b. The laser light is preferably irradiated on the metal paste layer 25 from the perpendicular direction of an angle of 90 degrees, but the laser light is more preferably irradiated on the metal paste layer 25 from an oblique direction of an angle in a range of 45 degrees to 145 degrees, further preferably an angle in a range of 70 degrees to 110 degrees.

The irradiation of the laser light causes scattering of the resin and/or metal powder contained in the metal paste layer 25 to create dust, which to be collected. The collection of the dust is preferably performed in a direction in parallel to the light guide plate 30 or in a direction at an angle within 30 degrees to the light guide plate 30.

When the first covering member 2 is disposed on the first surface and between the pair of electrodes 5 of a single light emitting element 1, in the step of forming a pair of electrodes 20, a portion of the first covering member 2 located on the first surface of the light emitting element and between the pair of electrodes 5 is preferably removed by using the laser light. That is, the first covering member 2 located between the pair of electrodes 5 is not completely removed by the laser light but partially remains. The first covering member 2 is electrically insulating, such that with the remaining portion of the first covering member 2, the occurrence of short circuit between the first wiring 20a and the second wiring 20b can be prevented. The remaining portion of the first covering member 2 preferably has a thickness in a range of ⅕ to ⅘ with respect to the thickness of the electrodes 5.

When irradiating the laser light, a plurality of the light emitting elements 1 are arranged on the light guide plate 30 in a matrix of row directions and column directions, namely in the X-axis direction and the Y-axis direction. The metal paste layer 25 is disposed with a predetermined width on the light emitting elements 1. Then, the laser light is irradiated between the pair of electrodes 5 of each of the light emitting elements 1. The light emitting elements 1 are arranged at predetermined locations such that although the electrodes 5 of the light emitting elements 1 cannot be visually recognized, the laser light can be irradiated between the pair of electrodes 5. At this time, in view of a possible deviation in the predetermined irradiation positions of laser light, the interval between the pair of electrodes 5 is preferably set in a range of about 1.5 times to about 5 times greater than the pulse width of the laser light.

As for a different method, it is preferable that the locations of the pair of electrodes 5 of the light emitting element 1 are detected in the step of providing a light emitting component, and a laser light is irradiated to the location between the pair of electrodes 5 of the light emitting element 1 detected in the step of providing a light emitting component. As described above, detecting the locations of the pair of electrodes 5 of the light emitting element 1 before irradiating the laser light allows for analyzing deviation of the light emitting element 1 in an up/down direction and rotational deviation of the light emitting element 1, which allows for precise laser irradiation to a predetermined location. Accordingly, the interval or margin between the pair of electrodes 5 can be reduced, which allows for the use of the light emitting element 1 of a smaller size.

Figure 3E:
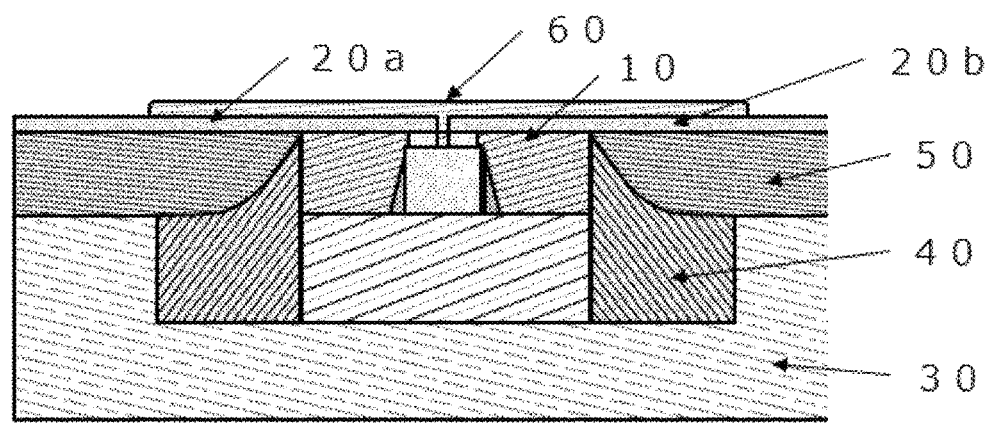
FIG. 3E is a schematic cross-sectional view illustrating the method of manufacturing a light emitting device according to the first embodiment.
Figure 4D:
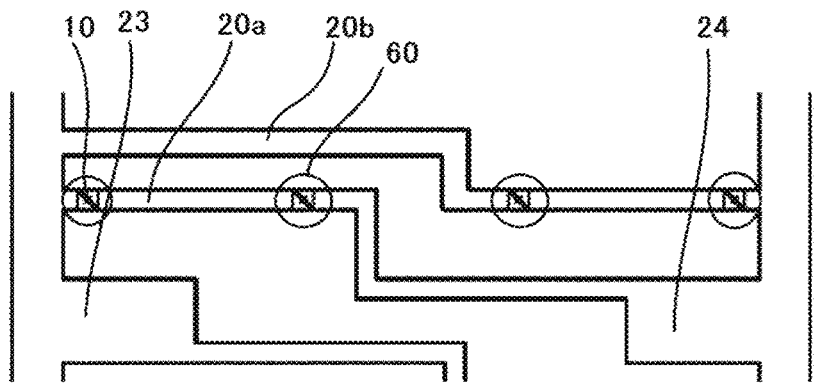
FIG. 4D is a schematic bottom view illustrating the method of manufacturing a light emitting device according to the first embodiment.

After the step of forming a pair of wirings, a step of covering at least the pair of electrodes 5 by the insulating member 60 may also be performed (FIG. 3E and FIG. 4D). A portion of the positive and/or negative electrodes 5 may be exposed by the laser ablation, which may cause a short circuit. Thus, covering the pair of electrodes 5 by the insulating member 60 can prevent or reduce the occurrence of a short circuit. The insulating member 60 may be applied covering not only the pair of electrodes 5 but also the pair of wirings 20, the second covering member 50, and the like. In the step of covering the pair of electrodes 5 by the insulating member 60, the insulating member 60 is preferably colored to be translucent or transparent.

Package 10

The package 10 at least includes a light emitting element 1 and a first covering member 2, and further includes a first light-transmissive member 3, a second light-transmissive member 4, etc. The light emitting element 1 has a pair of electrodes 5 on a first surface. The first covering member 2 is configured to cover lateral surfaces of the light emitting element, and thus has an electrically insulating property. The first covering member 2 preferably has light-reflecting properties, but may have a light-transmissive property. The first covering member 2 having light-reflecting properties can be made of, for example, a silicone resin containing about 60 wt % of silica and white titanium oxide, and can be molded by, for example, press-in molding, transfer molding, injection molding, printing, or spraying. The first covering member 2 can be molded in a plate-like shape which can be divided into a rectangular parallelepiped of a predetermined size.

The second light-transmissive member 4 in a liquid form is applied on a plurality of predetermined locations of the first light-transmissive member 3 having a plate-like shape, and a plurality of the light emitting elements 1 are respectively adhered thereon. The second light-transmissive member 4 in a liquid form is applied to the locations to be spaced apart from one other. The second light-transmissive member 4 can be applied in any appropriate shapes in a plan view, corresponding to the shape of the light emitting elements 1. For example, the second light-transmissive member 4 can be formed in a square shape, a rectangular shape, a circular, or an elliptic shape. The interval between adjacent second light-transmissive members 4 can be appropriately determined according to the external shape of the packages 10 and the number of packages 10 to be produced. Further, the second light-transmissive member 4 is preferably applied to cover about 70 to 150% of the planar dimension of the first light-transmissive member 3 in a plate-like shape.

When the light emitting elements 1 are disposed on the first light-transmissive member 3, the second light-transmissive member 4 in a liquid form rises up the lateral surfaces of the light emitting elements 1. Accordingly, when the light emitting elements 1 having been mounted on the first light-transmissive member 3, the outer surfaces of the second light-transmissive member 4 face obliquely upward. For example, a single light emitting element 1 and its corresponding second light-transmissive member 4 as a whole have a quadrangular prism shape. After disposing the light emitting elements 1 on the first light-transmissive member 3, the light emitting element 1 may be pressed as needed. After the light emitting elements 1 are disposed, heat is applied to the second light-transmissive member 4 in a liquid form, to obtain a cured second light-transmissive member 4.

The second light-transmissive member 4 is also present between each of the light emitting elements 1 and the first light-transmissive member 3, but the light emitting elements 1 and the first light-transmissive member 3 can be directly bonded without using the second light-transmissive member 4.

Subsequently, each package 10 is disposed on the light guide plate 30 via a third light-transmissive member 40 such that the first 3 is in contact with the light guide plate 30. The second covering member 50 is disposed to integrally cover the plurality of packages 10. The second covering member 50 can be made of, for example, a silicone resin containing about 60 wt % total of silica and white titanium oxide, and can be molded by, for example, press-in molding, transfer molding, injection molding, printing, or spraying.

The second covering member 50 may be disposed to cover all the packages 10 disposed on the light guide plate 30, then after curing the second covering member 50, the thickness of the second covering member 50 may be reduced by using a known processing method to expose the pair of electrodes 5 of the light emitting elements 1. Accordingly, the packages 10 of a predetermined thickness can be obtained. With this method, the heights of the pair of electrodes 5 and the second covering member 50 can be aligned, such that the metal paste layer 25 can be easily disposed by printing.

In the present embodiment, "a member in a plate-like shape" refers to a member having a large planar dimension that allows mounting of a plurality of light emitting elements 1.

Light Emitting Element 1

For the light emitting elements 1, for example, semiconductor light emitting elements such as light emitting diodes can be used, and light emitting elements configured to emit visible light such as blue, green, red, etc., can be used. Each of the semiconductor light emitting elements may include a layered structure containing a light emitting layer and electrodes. The layered structure may include a first surface at a side having the pair of electrodes, and a second surface to serve as a light extracting surface and is located opposite to the first surface.

The layered structure includes semiconductor layers that include a light emitting layer. The layered structure may further include a light-transmissive substrate such as sapphire. For example, the semiconductor layered structure can include three semiconductor layers of a first conductive-type semiconductor layer (for example, an n-type semiconductor layer), a light emitting layer (an active layer), and a second conductive-type semiconductor layer (for example, a p-type semiconductor layer). The semiconductor layers configured to emit ultraviolet light or blue to green region of visible light can be formed using a semiconductor material such as Group III-V compound semiconductors. More specific examples include nitride-based semiconductor materials such as $In_XAl_YGa_{1-X-Y}N$ ($0 \leq X$, $0 \leq Y$, $X+Y \leq 1$). For semiconductor layered structure configured to emit red light, GaAs, GaAlAs, GaP, InGaAs, InGaAsP, etc., can be used. The electrodes are preferably made of copper.

First Covering Member 2

The first covering member 2 is preferably made of a resin material having a thermosetting resin such as a silicone resin, a silicone-modified resin, an epoxy resin, and a phenol resin as its main component.

The first covering member 2 is preferably a resin member having light reflecting properties. In the present embodiment, the term "resin having light reflecting properties" refers to a resin material having a reflectance of 70% or greater to light from the light emitting elements 1. For example, a white resin can be preferably used. Accordingly, light reaching the first covering member is reflected toward the light-emitting surface of the light emitting device, such that the light-extraction efficiency of the light emitting device can be enhanced. The first covering member may be a light-transmissive resin member. In this case, a material similar to those for the first light-transmissive member illustrated later below can be used.

For the light reflecting resin, for example, a light transmissive resin having a light reflecting substance dispersed therein can be used. Suitable examples of the light-reflecting substance include titanium oxide, silicon oxide, zirconium oxide, potassium titanate, aluminum oxide, aluminum nitride, boron nitride, and mullite. The light reflecting material in the form of particles, fibers, flakes, or the like can be used, of those, in particular, the use of the light-reflecting material of fiber shape is expected to reduce the thermal expansion coefficient of the first covering member.

When the first covering member is formed with a resin member that contains a filler material such as a light reflecting substance, a resin component at portions of the surface irradiated by the laser light is removed by ablation, exposing the filler material on the surface. Further, by continuously moving or successively moving the irradiation spot of the laser light on the surface, a stripe shaped groove can be formed along the moving direction of the laser light. The groove can be formed, for example, with a width in a range of about 10 to 100 µm, typically 40 µm, with a depth in a range of 0.1 to 3 µm, according to the irradiation spot of the laser light.

First Light-transmissive Member 3

The first light-transmissive member 3 is disposed on the second surface of the light emitting element. Materials of the first light-transmissive member 3 include a resin and glass. Examples of the resin include thermosetting resins such as a silicone resin, a silicone-modified resin, an epoxy resin, and a phenol resin, and thermoplastic resin such as a polycarbonate resin, an acrylic resin, a methylpentene resin, and a polynorbornene resin. In particular, a silicone resin which has high heat-resisting property and high light-resisting property is preferable.

The first light-transmissive member 3 may contain one or more fluorescent materials as wavelength converting members, in addition to the light-transmissive material as described above. The one or more fluorescent materials are configured to be excited by the light emitted from respective corresponding light emitting elements. Specific examples of the fluorescent material that can be excited by light emitted from a blue light emitting element or an ultraviolet light emitting element include a yttrium aluminum garnet-based fluorescent material activated with cerium (YAG:Ce), a lutetium aluminum garnet-based fluorescent material activated with cerium (LAG:Ce), a nitrogen-containing calcium aluminosilicate activated with europium and/or chromium ($CaO-Al_2O_3-SiO_2$), a silicate (($Sr,Ba)_2SiO_4$)-based fluorescent material activated with europium, a nitride-based fluorescent materials such as a β-sialon-based fluorescent material, a CASN-based fluorescent material, and a SCASN-based fluorescent material, a KSF-based fluorescent material ($K_2SiF_6$:Mn), a sulfide-based fluorescent material, and a quantum dot fluorescent material. With a combination of one or more of the fluorescent materials described above and a blue light emitting element or an ultraviolet light emitting element, light emitting devices of various emission colors (for example, a light emitting device to emit a white light) can be manufactured.

The first light-transmissive member 3 may further contain one or more of various types of filler materials can be included, for example, to adjust a viscosity of the material.

Second Light-Transmissive Member 4

The second light-transmissive member 4 is configured to bond the plurality of light emitting elements 1 and corresponding first light-transmissive members 3. The second light-transmissive member 4 may contain a fluorescent material or a filler material.

Appropriate variations in the configurations of those described in the embodiments can also be included, without departing from the scope of the invention.

Light Guide Plate 30

The light guide plate 30 has a plate-like shape which may include recesses and/or protrusions. The packages may be disposed in the recesses. The recesses and/or protrusions may be configured to serve as lenses. In order to render visibility to the light guide plate 30, one or more depressions, a light-shielding portion and/or a light-reflecting film may be provided on the light guide plate 30. Providing a light-reflecting film or a light-shielding film on the light guide plate at a side opposite to the side disposed with the package allows for spreading light from the package through the light guide plate into a lateral direction, that is in the X-axis direction and the Y-axis direction.

The base 90 preferably includes a first recess 30a defined by an upward-facing surface and lateral surfaces, and a second recess 30b defined in a shape different than the first recess 30a, and a second covering member 50 disposed in the second recess 30b.

It is preferable that the light emitting element 1 is disposed in the first recess 30a and the wirings 20 are disposed on the second covering member 50.

Figure 5:
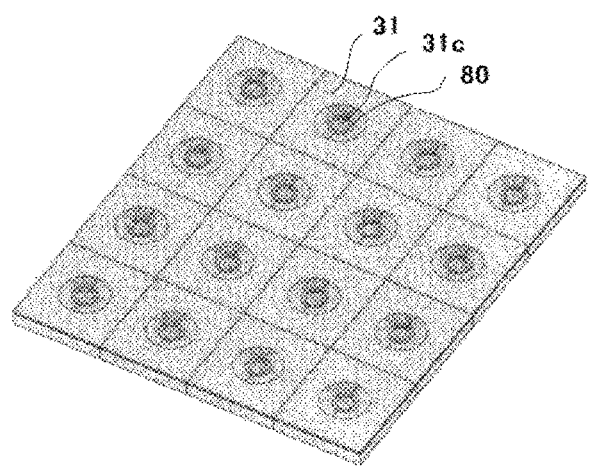
FIG. 5 is a schematic perspective view of a light emitting device according to a second embodiment, seen from the light guide plated side.
Figure 6:
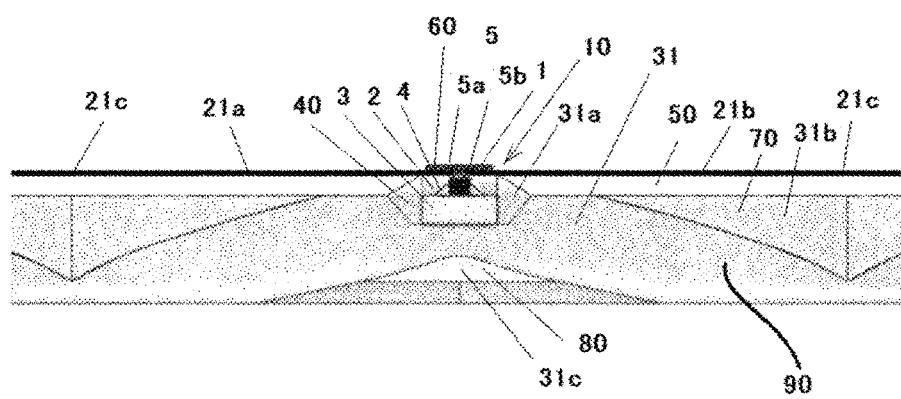
FIG. 6 is a schematic cross-sectional view of a light emitting device according to the second embodiment.
Figure 7:
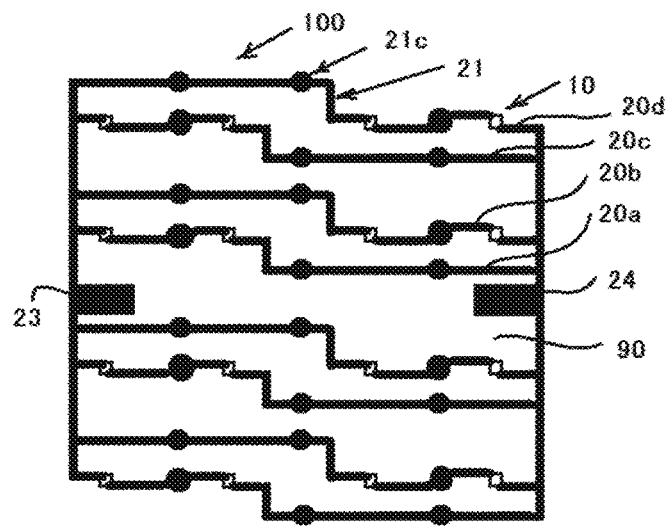
FIG. 7 is a schematic plan view illustrating arrangements of external terminals, wirings and light emitting elements in a light emitting device according to the second embodiment.

A light emitting device according to a second embodiment will be described below with reference to figures. FIG. 5 is a schematic perspective view of a light emitting device according to a second embodiment, seen from the light guide plated side. FIG. 6 is a schematic cross-sectional view of a light emitting device according to the second embodiment. FIG. 7 is a schematic plan view of a light emitting device according to a first embodiment. The schematic perspective view shown in FIG. 5 illustrates a single segment including a total of 16 cells, 4 cells in each row and 4 cells in each column. A planar light source of a desired size can be obtained by combining a plurality of the segments. In the schematic sectional view of a light emitting device according to the second embodiment a single cell is illustrated.

The light emitting device includes a first wiring 20a having a first thickness, a second wiring 20b having a second thickness, and a third wiring 20c having a third thickness, the second thickness is greater than the first thickness, and the third thickness is greater than the second thickness. The light emitting device also includes a fourth wiring 20d having a fourth thickness, the fourth thickness is greater than the third thickness. Varying the thickness of the wirings allows for the wirings to have a substantially same resistance, which allows obtaining a light emitting device of a small size and can emit light with little color unevenness.

The first wiring 20a, the second wiring 20b, and the third wiring 20c preferably have a same width. Wirings are provided without varying the width, such that unified appearance can be achieved. At the wirings, a greater thickness can be obtained, for example, by applying the material plural times to predetermined locations.

The base 90 preferably includes a light-guide plate 31 formed with a first recess 31a defined by an upward facing surface and lateral surfaces, and a second recess 31b defined in a shape different than the first recess 31a, and a second covering member 50 and a light-reflecting member 70 disposed in the second recess 31b.

It is preferable that the light emitting element 1 is disposed in the first recess 31a and the wirings 21 are disposed on the second covering member 50.

The base 90 preferably has a sheet shape. With this arrangement, the light emitting device with a further smaller thickness can be provided. The light emitting device is particularly useful when combined with a lens etc., to form a module.

For the light emitting device according to the second embodiment, a predetermined light guide plate 31 is used. The light guide plate 31 has an upper flat surface at a side where the package 10 is disposed. In the description below, the surface of the light guide plate 31 located opposite to the upper flat surface will be referred to as a "lower surface". Light from the package 10 is released from the lower surface side of the light guide plate 31. A single cell of the light guide plate 31 has a region to dispose a single package 10, and a first recess 31a defined by lateral surfaces and an upward facing surface is formed in the region. Second recesses 31b are defined in the light guide plate 31 at locations between adjacent first recesses 31a. In a plan view, the second recesses 31b are formed in a lattice shape, in which arrays of parallel lines are arranged perpendicularly to each other. The package 10 includes a light emitting element 1 on a first light-transmissive member 3, a second light-transmissive member 4 on lateral surfaces of the light emitting element 1, and a first light-transmissive member 2 covering the second light-transmissive member 4. The first recess 31a is defined in a triangular prism shape with an opening widening upward. That is, a planar dimension of an opening edge of the recess is greater than a planar dimension of the upward facing surface of the first recess 31a. The package 10 is disposed on the upward facing surface of the first recess 31a such that the first light-transmissive member 3 of the package 10 is in contact with the upward facing surface of the recess. The second light-transmissive member 40 is disposed on the lateral surfaces of the package 10. A light-reflecting member 70 is disposed in a second recess 31b of the light guide plate 31. The upper surface of the light-reflecting member 70 and the upper surface of the light guide plate 31 are covered by the covering layer 50. The light-reflecting member 70 and the second covering member 50 are made off a resin containing a light-reflecting member such that light emitted from the package 10 can be reflected efficiently, and light from the package 10 is emitted from the lower surface side of the light-reflecting member 31. The second recess 31b is defined by inclined lateral surfaces such that light from the package 10 can be easily emitted from the lower surface of the light guide plate 31. The inclined lateral surfaces preferably have angles such that light can be extracted in a perpendicular direction with respect to the lower surface of the light guide plate 31. The wirings 21 are disposed on the second covering member 50. The first wiring 21a is electrically connected to the first electrode 5a of the package 10 and the second wiring 21b is electrically connected to the second electrode 5b of the package 10 and the respective connecting portions are covered by an insulating member 60. The inclined lateral surfaces defining the second recess 31b form the deepest part at locations between adjacent first recesses 31a, which are the boundary between the cells. The light-reflecting member 70 is disposed in the second recess 31b. The resin used for the light-reflecting member 70 is likely to sink in the course of curing the resin, which may create a dent in the upper surface of the light-reflecting member 70 disposed in the second recess 31b. Because such a dent may cause disconnection to the wirings 21 at the time of disposing the wirings 21 by printing etc., wider portions 21c are formed at parts of the wirings 21 as shown in FIG. 7. Not to the extent to cause disconnection in the wirings 21, blur portion(s) and/or thinner portion(s) may occur in printing the wirings 21, which may increase the electric resistance. For this reason, wider portions 21c are preferably formed at parts of the wirings 21 at locations corresponding to a deepest portion of the dent and/or the boundary between the cells. The wider portions 21c of the wirings 21 can be formed not only in a circular shape or an elliptic shape but also in a rectangular shape or a polygonal shape, at not only a single location but also a plurality of locations, or further, in a plurality of lines. When a plurality of wider portions 21c are formed corresponding to the boundary between the cells, the plurality of the wider portions 21c are preferably formed in an approximately straight line.

The lower surface of the light guide plate 31 is preferably formed with a third recess 31c at a location opposite from the first recess 31a. The third recess 31c is preferably formed in, for example, a conical shape or a polygonal pyramid shape, opening downward. This is because with the third recess 31c formed in a conical shape opening downward, light emitted from the package 10 and transmitted through the light guide plate 31 can be spread in a horizontal direction and in oblique directions. A light-shielding member 80 may be disposed in the third recess 31c as shown in FIG. 6. Of the light emitted from the package 10, light emitted in a directly upward direction from the package 10 has the largest intensity, which may create uneven emission when viewed over the entire of the light guide plate 31. Accordingly, providing the light-shielding member 80 in the third recess 31c can reduce the intensity of light emitted in a directly upward direction from the package 10, such that unevenness in the emission can be reduced. The light-shielding member 80 can be disposed to cover the entire of the third recess 31c, but is preferably disposed to cover only a portion of the third recess 31c, for example, a range of about ¼ to ¾ of the depth of the third recess 31c is preferable. The light-shielding member 80 preferably covers an area approximately the same as to about twice the size of the first recess 31a when viewed from the lower surface side of the light guide plate 31. It is preferable that after the light-shielding member 80 is disposed in the third recess 31c, the rest part of the third recess 31c corresponds to a truncated cone shape with its bottom opening downward at the lower surface of the light guide plate 31.

As described above, the light guide plate 31 defines a plurality of the first recesses 31a and a plurality of second recesses 31b in its upper surface, each of the first recesses 31a has a light emitting element 1 disposed therein, and the second recesses 31b are formed between adjacent first recesses 31a. The light-reflecting member 70 is disposed in each of the second recesses 31b, the second covering member 50 is disposed covering the light-reflecting members 70, and the wirings 21 are disposed on corresponding portions of the second covering member 50. The wirings 21 disposed on the second recesses 31b preferably have wider portions 21c having widths greater than the wirings 21 disposed on the first recesses 31a.

Figure 8:
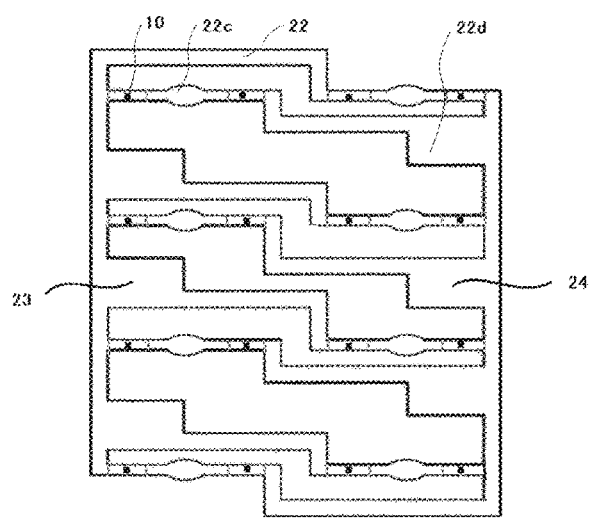
FIG. 8 is a schematic plan view illustrating arrangements of external terminals, wirings and light emitting elements in a light emitting device according to a third embodiment.

A light emitting device according to a third embodiment will be illustrated below with reference to FIG. 8. FIG. 8 is a schematic plan view of a light emitting device according to the third embodiment.

The light emitting device according to the third embodiment has a structure approximately similar to that of the second embodiment except for the shapes of the wirings. In the third embodiment, the wirings 22 have wide portions 22c between two packages 10 adjacent in a lateral direction, particularly at approximately center between the two packages 10 adjacent in a lateral direction. Approximately center of each portion of the wiring 22 in a lateral direction has a portion having a shape bent in a crank shape at a location spaced apart from the portion between the two adjacent packages 10. Forming the portions of the wirings 20 with such a shape bent in a crank shape allows for the reduction or elimination of blur portion(s) and/or thinner portion(s) at the time of printing. Further, at each portion of the wirings 22 in the lateral direction, a wide portion 22d having a width greater than other portions is provided at a location opposite to the portion disposed with the packages 10. Partially widening each portion of the wirings 22 allows for reducing electric resistance and/or reducing or preventing the occurrence of disconnection. The length of each of the wide portions 22c in a lateral direction can be determined appropriately, but each of the wide portions 22c is preferably provided extended in the vicinity of corresponding adjacent bulging portions 22c in a longitudinal direction.

Figure 9:
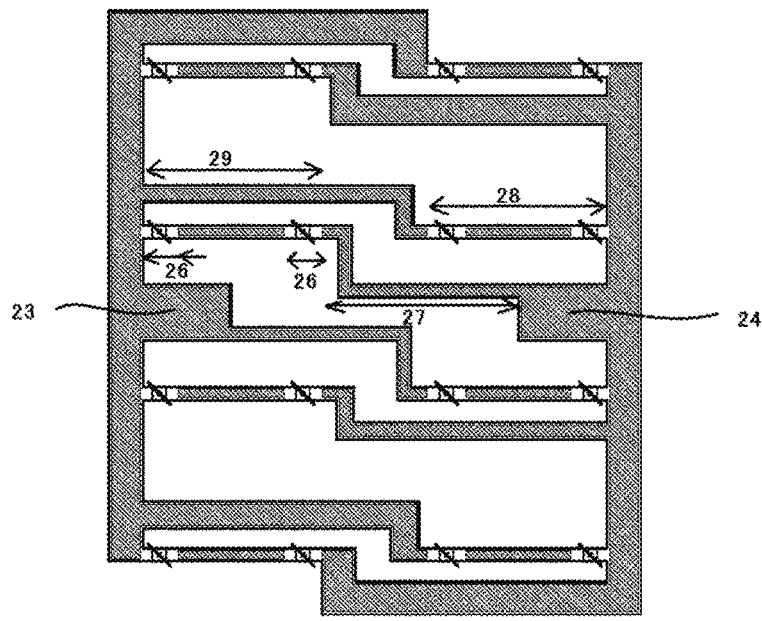
FIG. 9 is a schematic plan view illustrating arrangements of external terminals, wirings and light emitting elements in a light emitting device according to a fourth embodiment.

A light emitting device according to a fourth embodiment will be illustrated below with reference to FIG. 9. FIG. 9 is a schematic plan view of a light emitting device according to the fourth embodiment.

The light emitting device according to the fourth embodiment includes a structure similar to the base and the wirings according to the first embodiment, except that, the light emitting device according to the fourth embodiment includes the second wiring 20b having a thickness greater than that of the first wiring 20a, and the third wiring 20c has a thickness greater than that of the second wiring 20b. With the structure as described above, a light emitting device of a small size and can emit light with little color unevenness can be provided. The electric resistance can be reduced through the thicknesses and the widths of portions of the wirings, and the light emitting device to emit light with little color unevenness can be provided.

It is preferable that at least two wirings among the first wiring 20a, the second wiring 20b, and the third wiring 20c, at least two light emitting elements 1 are disposed on each wirings, and a portion of each wirings between two light emitting elements has an average width smaller than an average width of a region 29 of each wirings which do not have any light emitting elements disposed thereon. This arrangement allows for a reduction in electric resistance in the second regions 27, which can improve electrical conductivity. Further, the reduction in the thicknesses of the first regions 26 provided with the light emitting elements 11 allows for a reduction in electric power used for disposing the wirings 20, or a reduction in time required for removing parts of the conductive paste by a laser light. The first regions 26 preferably cover at least the respect corresponding light emitting elements 1, or disposed to cover the entire of the package 10. Further, because the packages 10 and the second covering member 50 are made of different materials, a step may be created therebetween, such that the second regions 27 preferably cover a portion of the packages 10 in view of stability of the electric resistance. The thickness of the wirings in the first regions 26 is preferably in a range of 1.0 to 7.5 μm and the thicknesses of the wirings in the second regions 27 are preferably in a range of 10 to 20 μm.

Figure 10:
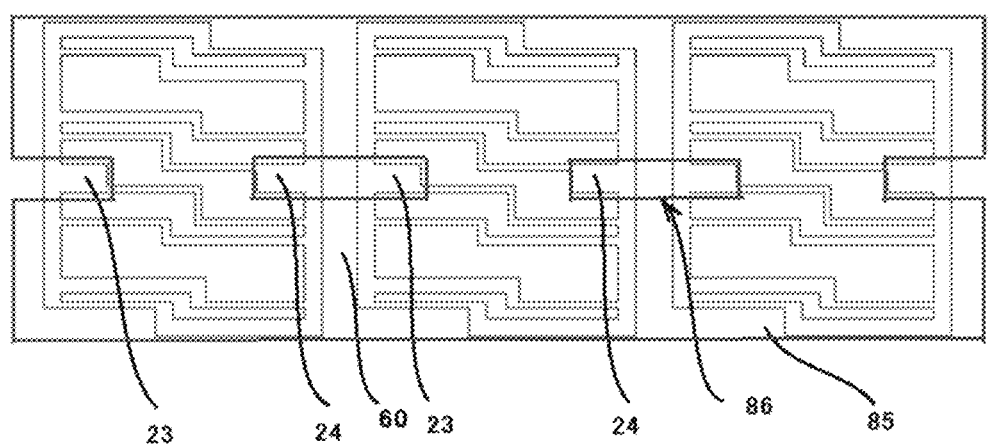
FIG. 10 is a schematic plan view illustrating the use of a light mask according to a fifth embodiment.
Figure 11:
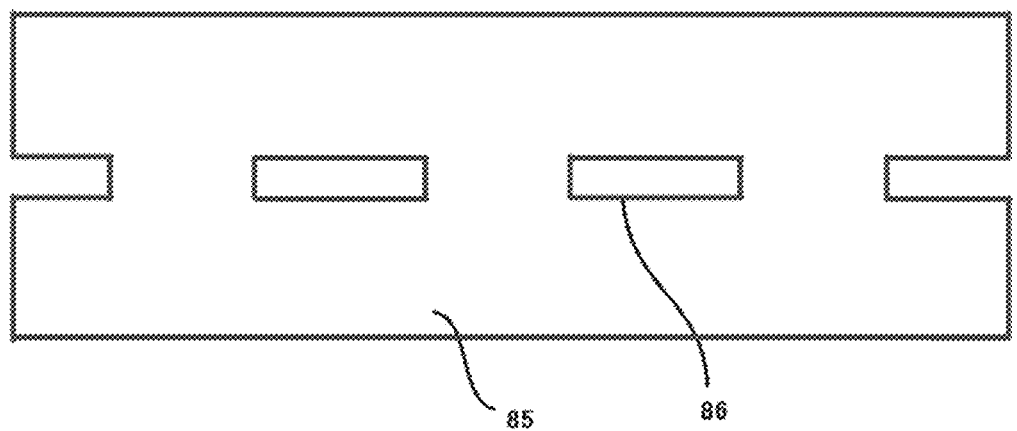
FIG. 11 is a schematic plan view of the light mask according to the fifth embodiment.

A light emitting device according to a fifth embodiment will be illustrated below with reference to figures. FIG. 10 is a schematic plan view of a light emitting device according to a fifth embodiment. FIG. 11 is a schematic plan view of a light mask according to the fifth embodiment. The electrically insulating member 60 preferably covers entire surfaces of the wirings except for the first external terminal 23 and the second external terminal 24. With this, the occurrence of short-circuit and/or malfunction can be reduced. Also, it is preferable that the electrically insulating member 60 is formed flat or disposed in the same thickness, or a side to be provided with the electrically insulating member 60 is formed to have the same height. With this arrangement, stability in mounting and/or heat dissipation properties can be enhanced.

The first external terminals 23 and the second external terminals 24 can be formed such that applying a mask 85 defining openings corresponding to the first external terminals 23 and the second external terminals 24, and applying a resist over the mask, removing the mask, applying an electrically insulating member 60 on the entire surface, then removing the resist by etching, etc., to expose only the portions of the first external terminals 23 and the second external terminals 24.

Figure 12:
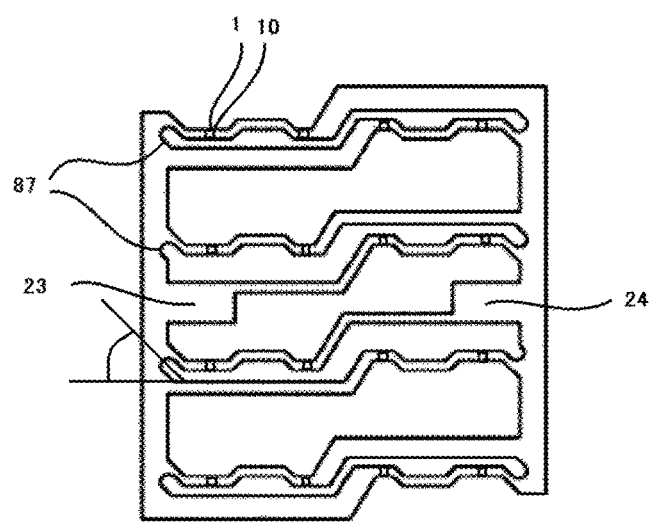
FIG. 12 is a schematic plan view illustrating arrangements of external terminals, wirings and light emitting elements in a light emitting device according to a sixth embodiment.

A light emitting device according to a sixth embodiment will be illustrated below with reference to FIG. 12. FIG. 12 is a schematic plan view of a light emitting device according to the sixth embodiment.

The light emitting device according to the sixth embodiment preferably has a structure in which the wirings are formed with recess-shaped opening portions 87 along respective directions each being at an angle with respect to the X-axis direction, and defined in the common portion of the first wiring 20a, the second wiring 20b, and the third wiring 20c, at the respective base portion of each of the wirings. With this arrangement, the occurrence of short-circuit of the light emitting elements located near the common portion can be prevented or reduced. That is, when a portion of the wirings has a greater thickness and/or width, a dividing distance increases at the time of removing a portion of the conductive paste layer by using a laser light, which may result in uncompleted dividing, but with the structure as described above, such uncompleted dividing can be avoided. The angle to the X-axis direction is preferably in a range of 20 to 70 degrees, more preferably in a range of 30 to 60 degrees, particularly preferably in a range of 40 to 50 degrees.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting device comprising:
a base;
a first external terminal disposed on the base;
a second external terminal disposed on the base;
a plurality of wirings disposed on the base and including
a first wiring electrically connecting the first external terminal and the second external terminal at a first distance,
a second wiring electrically connecting the first external terminal and the second external terminal at a second distance greater than the first distance, and
a third wiring electrically connecting the first external terminal and the second external terminal at a third distance greater than the second distance, the first wiring, the second wiring, and the third wiring having a substantially equal electric resistance; and a plurality of light emitting elements each electrically connected to a corresponding one of the plurality of wirings such that at least two of the first wiring, the second wiring, and the third wiring are each provided with at least two of the light emitting elements with an average width in an intermediate region between adjacent ones of the light emitting elements being smaller than an average width in a region other than the intermediate region and not provided with any of the light emitting elements.

2. The light emitting device according to claim 1, wherein each of the first wiring, the second wiring and the third wiring includes a first region in which one of the light emitting elements is arranged and a second region in which none of the light emitting elements is arranged, a thickness in the second region being greater than a thickness in the first region.

3. The light emitting device according to claim 1, wherein each of the first wiring, the second wiring and the third wiring includes a first region in which one of the light emitting elements is arranged and a second region in which none of the light emitting elements is arranged, a width in the second region being greater than a width in the first region.

4. The light emitting device according to claim 1, wherein the first external terminal and the second external terminal are generally aligned along an X-axis direction and at least two of the first wiring, the second wiring, and the third wiring share a common portion extending along a Y-axis direction orthogonal to the X-axis direction.

5. The light emitting device according to claim 1, wherein the light emitting device includes an electrically insulating member covering at least a first region in which one of the light emitting elements is arranged.

6. The light emitting device according to claim 5, wherein the electrically insulating member covers entire surfaces of the wirings while the first external terminal and the second external terminal are exposed from the electrically insulating member.

7. The light emitting device according to claim 5, wherein the electrically insulating member is colored.

8. The light emitting device according to claim 1, wherein the base includes a light-guide plate formed with a plurality of first recesses each defined by an upward-facing surface and lateral surfaces, and a plurality of second recesses each defined in a shape different than the first recesses, and a second covering member disposed in each of the second recesses, the light emitting elements are located respectively in the first recesses of the base, and the wirings are disposed on the second covering member.

9. The light emitting device according to claim 1, wherein the base has a sheet shape.

10. A light emitting device comprising:

a base;

a first external terminal disposed on the base;

a second external terminal disposed on the base;

a plurality of wirings disposed on the base and including a first wiring electrically connecting the first external terminal and the second external terminal at a first distance, a second wiring electrically connecting the first external terminal and the second external terminal at a second distance greater than the first distance, the second wiring having a planar dimension and a width greater than a planar dimension and a width, respectively, of the first wiring in a plan view, and a third wiring electrically connecting the first external terminal and the second external terminal at a third distance greater than the second distance, the third wiring having a planar dimension and a width greater than the planar dimension and the width, respectively, of the second wiring in the plan view; and a plurality of light emitting elements each electrically connected to a corresponding one of the wirings such that at least two of the first wiring, the second wiring, and the third wiring are each provided with at least two of the light emitting elements with a width in an intermediate region between adjacent ones of the light emitting elements being smaller than a width of another region having a substantially same length as the intermediate region and not provided with any of the light emitting elements.

11. The light emitting device according to claim 10, wherein the first wiring, the second wiring, and the third wiring have a substantially same thickness.

12. A light emitting device comprising:

a base;

a first external terminal disposed on the base;

a second external terminal disposed on the base;

a plurality of wirings disposed on the base and including a first wiring electrically connecting the first external terminal and the second external terminal at a first distance, a second wiring electrically connecting the first external terminal and the second external terminal at a second distance greater than the first distance, the second wiring having a thickness greater than a thickness of the first wiring, and a third wiring electrically connecting the first external terminal and the second external terminal at a third distance greater than the second distance, the third wiring having a thickness greater than the thickness of the second wiring; and a plurality of light emitting elements each electrically connected to a corresponding one of the wirings.

13. The light emitting device according to claim 12, wherein the first wiring, the second wiring, and the third wiring have a substantially same width in a plan view.

14. The light emitting device according to claim 12, wherein at least two of the first wiring, the second wiring, and the third wiring are each provided with at least two of the light emitting elements with an average width at an intermediate region between adjacent ones of the light emitting elements being smaller than an average width of a region other than the intermediate region and not provided with any of the light emitting elements.

* * * * *